(12) United States Patent
Miyahara

(10) Patent No.: US 10,313,593 B2
(45) Date of Patent: Jun. 4, 2019

(54) IMAGE STABILIZATION APPARATUS AND IMAGE STABILIZATION METHOD

(71) Applicant: CANON KABUSHIKI KAISHA, Tokyo (JP)

(72) Inventor: Shimpei Miyahara, Inagi (JP)

(73) Assignee: Canon Kabushiki Kaisha, Tokyo (JP)

( * ) Notice: Subject to any disclaimer, the term of this patent is extended or adjusted under 35 U.S.C. 154(b) by 168 days.

(21) Appl. No.: 15/290,498

(22) Filed: Oct. 11, 2016

(65) Prior Publication Data

US 2017/0134658 A1    May 11, 2017

(30) Foreign Application Priority Data

Nov. 5, 2015   (JP) ................... 2015-217921

(51) Int. Cl.
| | |
|---|---|
| *H04N 5/232* | (2006.01) |
| *H03H 17/02* | (2006.01) |
| *H03H 17/04* | (2006.01) |

(52) U.S. Cl.
CPC ..... *H04N 5/23287* (2013.01); *H03H 17/0211* (2013.01); *H03H 17/04* (2013.01); *H04N 5/23254* (2013.01); *H04N 5/23258* (2013.01); *G03B 2205/0007* (2013.01); *G03B 2217/005* (2013.01)

(58) Field of Classification Search
CPC ........... H04N 5/23287; H04N 5/23254; H04N 5/23258; H03H 17/0211; H03H 17/04; G03B 2205/0007; G03B 2217/005
See application file for complete search history.

(56) References Cited

U.S. PATENT DOCUMENTS

| | | | | |
|---|---|---|---|---|
| 8,169,487 | B2 * | 5/2012 | Noguchi | ............... G03B 17/00 348/208.11 |
| 8,416,307 | B2 * | 4/2013 | McLeod | ............ H04N 5/23248 348/208.2 |
| 2008/0136923 | A1 * | 6/2008 | Inbar | .................... G02B 27/646 348/208.2 |
| 2012/0014681 | A1 * | 1/2012 | Miyahara | ............. G02B 27/646 396/55 |

FOREIGN PATENT DOCUMENTS

| | | |
|---|---|---|
| JP | 2005-043780 A | 2/2005 |
| JP | 2008-192060 A | 8/2008 |
| JP | 2014-211531 A | 11/2014 |

* cited by examiner

*Primary Examiner* — Lin Ye
*Assistant Examiner* — Chriss S Yoder, III
(74) *Attorney, Agent, or Firm* — Cowan, Liebowitz & Latman, P.C.

(57) ABSTRACT

An image stabilization apparatus comprises: an identification unit that, based on an angular velocity signal outputted from a shake detection unit, a motion vector calculated from a difference between frames of images outputted from an image sensor, and a position signal indicating a position of a correction unit that corrects a shake optically, identifies an output variation of the shake detection unit; and a conversion unit that converts the angular velocity signal into a shake correction amount by correcting the angular velocity signal based on the output variation identified by the identification unit.

23 Claims, 12 Drawing Sheets

IMAGE STABILIZATION APPARATUS AND IMAGE STABILIZATION METHOD

BACKGROUND OF THE INVENTION

Field of the Invention

The present invention relates to an image stabilization apparatus and an image stabilization method.

Description of the Related Art

Interchangeable lenses and image capturing apparatuses comprising an image stabilization apparatus that detects a camera shake and moves a lens or an image sensor that can move to correct an image shake due to the detected camera shake are known. An image stabilization function of such a method is known as optical image stabilization. Also, in recent years, there are image stabilization functions that, for a moving image, output by extracting a frame image whose position is shifted in a direction that cancels a camera shake, and this is used in small-scale/light weight image capturing apparatuses, and mobile telephones with image capturing apparatuses. Image stabilization of such a method is known as electrical image stabilization.

As a method of detecting a shake, an angular velocity sensor (gyro sensor) is typical, and the shake is corrected by moving a lens or an image sensor in a direction that cancels the shake based on the detected angular velocity. In Japanese Patent Laid-Open No. 2005-43780, it is disclosed that prediction is conducted by feeding back in real time an offset of an angular velocity sensor calculated from a motion vector into an image stabilization drive amount to modify the angular velocity sensor offset.

Also, in recent years, in accordance with the acceleration of image capturing apparatus frame rates and improvements in image processing, techniques that detect a shake by analyzing shake in images between frames to obtain a motion vector are known.

Meanwhile, as advanced imaging methods there is a panning shot, and there is macro imaging where the subject is at a short distance. Macro imaging is when the subject is at a short distance, and in such cases, since a translational shake component of the image capturing apparatus that is in addition to a normal angular shake cannot be ignored, there is an increased need for image stabilization since camera shake is larger than in ordinary imaging. Consequently there are techniques for raising the precision of a camera shake correction amount by detecting the translational shake using an acceleration sensor, and calculating the translational shake component separately from the angular shake. Also, there are techniques for improving an image stabilization effect at a time of macro imaging in cases where no acceleration sensor is comprised by predicting an acceleration component of the image capturing apparatus from a position signal and a drive amount of the image stabilization apparatus, and calculating the translational shake component from the predicted acceleration.

A panning shot is imaging while tilting or panning the image capturing apparatus in accordance with a subject that moves. In such an imaging method, the subject is accentuated and the subject is caused to have motion by imaging by intentionally causing the background of the subject that moves to flow past without causing the subject that is moving to shake. Such an imaging method requires sophisticated technology and so there are techniques that assist by correcting image blur by driving an image stabilization apparatus.

In Japanese Patent Laid-Open No. 2014-211531, in a method of assisting a panning shot, it is disclosed that a panning amount is calculated from a motion vector and an angular velocity detection signal of an angular velocity sensor, and a difference between the angular velocity detection signal and the panning amount is used to execute image stabilization. By this, an adverse effect due to image stabilization in the panning shot assistance function is reduced.

Also, a technique in which, in shake detection by a motion vector, an image is divided into small blocks, a local motion vector is calculated for each block, and then an overall global motion vector is calculated from the plurality of local motion vectors is disclosed in Japanese Patent Laid-Open No. 2008-192060. By this, it is possible to remove elements other than camera shake due to erroneous calculation of a motion vector due to image noise or blurriness due to movement of the object.

However, in image stabilization apparatuses that use an angular velocity sensor, it was not possible to sufficiently raise the performance of image stabilization due to the following two reasons.

The first is offset calculation error in the angular velocity sensor. Because an angular velocity sensor includes sensor specific offset noise and low frequency band noise due to temperature fluctuation, it is not possible to apply a complete integral in integration processing at a time of calculating an image stabilization value. In performing a pseudo integral in a low-pass filter (LPF) for integration processing, it is necessary to sacrifice ultra-low-frequency component performance.

The second is angular velocity sensor sensitivity variation. Various adjustments are made on the image capturing apparatus at the time of shipment in order to reduce sensitivity variation, but an 100% image stabilization effect cannot necessarily be achieved since an adjustment error component necessarily remains.

Also, costs increase due to incorporation of an acceleration sensor in the case where an image stabilization effect at a time of macro imaging is improved by using an acceleration sensor. Meanwhile, in cases where the acceleration on the image capturing apparatus is predicted from the drive amount and the position signal of the image stabilization apparatus, there is a problem in that estimation accuracy is bad if the shake is a minute shake.

Also, in Japanese Patent Laid-Open No. 2005-43780, since the offset of the angular velocity sensor is updated in real time by feedback control, there are cases in which the anti-shake performance deteriorates in the middle of prediction (while waiting for a still image). Though it depends on the design of the feedback gain of the feedback control, the problem that deterioration of anti-shake performance remains when the feedback gain is made to be larger, even though convergence of the prediction is faster. Also, when the feedback gain is made to be smaller, though the extent of the deterioration of anti-shake performance during prediction becomes smaller, the speed of convergence becomes slower.

Also, in Japanese Patent Laid-Open No. 2014-211531, while calculation of the panning amount and panning determination are performed from output of the angular velocity sensor and a motion vector differences, sensitivity variation and an offset component which is angular velocity sensor specific noise have not been considered. For this reason, there are cases in which an error in the calculation result remains, and sufficient panning shot determination precision and assistance precision have not been achieved.

SUMMARY OF THE INVENTION

The present invention has been made in consideration of the above situation, and increases a correction effect in image stabilization processing that uses an angular velocity sensor.

According to the present invention, provided is an image stabilization apparatus comprising: an identification unit that, based on an angular velocity signal outputted from a shake detection unit, a motion vector calculated from a difference between frames of images outputted from an image sensor, and a position signal indicating a position of a correction unit that corrects a shake optically, identifies an output variation of the shake detection unit; and a conversion unit that converts the angular velocity signal into a shake correction amount by correcting the angular velocity signal based on the output variation identified by the identification unit.

Further, according to the present invention, provided is an image stabilization method, comprising: identifying an output variation of a shake detection unit based on an angular velocity signal outputted from the shake detection unit, a motion vector calculated from a difference between frames of images outputted from an image sensor, and a position signal indicating a position of a correction unit that corrects a shake optically; correcting the angular velocity signal based on the identified output variation and converting the corrected angular velocity signal into a shake correction amount; and correcting the shake based on the shake correction amount.

Further features of the present invention will become apparent from the following description of exemplary embodiments (with reference to the attached drawings).

BRIEF DESCRIPTION OF THE DRAWINGS

The accompanying drawings, which are incorporated in and constitute a part of the specification, illustrate embodiments of the invention, and together with the description, serve to explain the principles of the invention.

DESCRIPTION OF THE EMBODIMENTS

Exemplary embodiments of the present invention will be described in detail in accordance with the accompanying drawings.

First Embodiment

Figure 1:
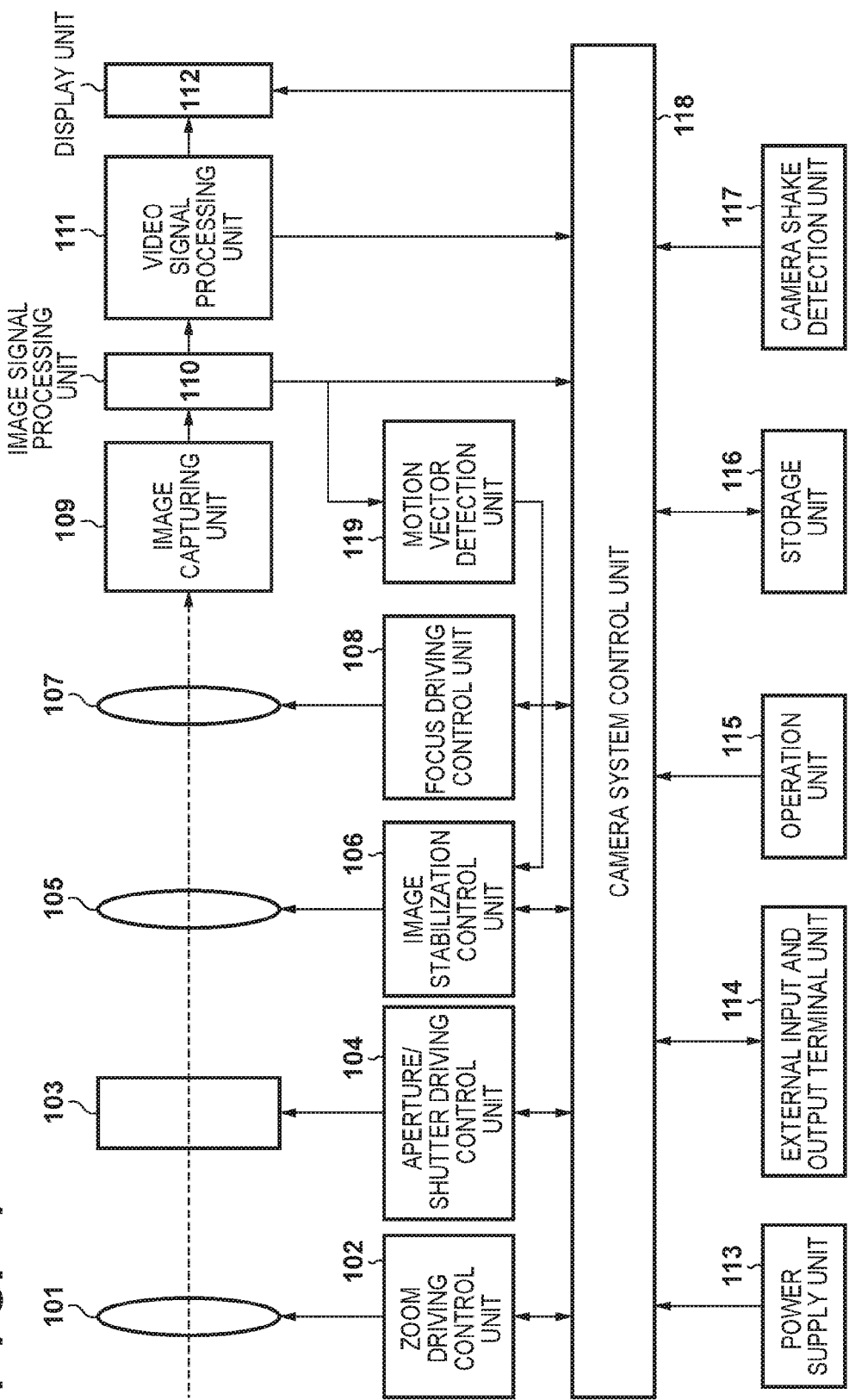
FIG. 1 is a block diagram illustrating a functional configuration of an image capturing apparatus according to an embodiment of the present invention.

FIG. 1 is a block diagram illustrating a functional configuration of an image capturing apparatus including an image stabilization apparatus according to a first embodiment of the present invention, which here is a digital camera for imaging still images and moving images.

In FIG. 1, an optical system is configured to include a zoom unit 101 that includes a zoom lens for magnification/reduction, an aperture/shutter unit 103, an image stabilization unit 105, and a focus unit 107 that includes a lens for adjusting focus. For the zoom unit 101, drive control is performed by a zoom driving control unit 102, and for the aperture/shutter unit 103, drive control is performed by an aperture/shutter driving control unit 104. Also, for the image stabilization unit 105, drive control is performed by an image stabilization control unit 106, and for the focus unit 107, drive control is performed by a focus driving control unit 108.

An image capturing unit 109 performs photoelectric conversion of an optical image that passes through the above described optical system into an electric signal. The electric signal outputted from the image capturing unit 109 is converted into a video signal by an image signal processing unit 110, and further processed by a video signal processing unit 111 in accordance with the intended use. A display unit 112 performs an image display as necessary based on a signal outputted from the video signal processing unit 111.

A power supply unit 113 supplies power in accordance with the intended use to the image capturing apparatus overall. An external input and output terminal unit 114 inputs/outputs communication signals and video signals from/to external apparatuses (not shown).

An operation unit 115 is used to operate the system, and includes an image stabilization ON/OFF switch, a shutter release button, a moving image recording switch, a playback mode selection switch, and a magnification/reduction switch.

The image stabilization ON/OFF switch enables selection of ON/OFF for image stabilization, and when ON is selected for image stabilization by the image stabilization ON/OFF switch, a camera system control unit 118 instructs the image stabilization control unit 106 to perform an image stabilization operation. The image stabilization control unit 106, having received this, performs the image stabilization operation until an image stabilization OFF instruction is made.

The shutter release button is configured to enable a two stage operation so as to turn on a first switch (SW1) and a second switch (SW2) in order in accordance with the amount that it is pressed in. The structure is such that the first switch SW1 is turned on when the shutter release button is pushed in approximately half way (first stage), and the second switch SW2 is turned on when the shutter release button is pushed in fully (second stage). When the first switch SW1 is turned on, the focus driving control unit 108 drives the focus unit 107 which includes a focusing lens to perform focus adjustment, and the aperture/shutter driving control unit 104 drives the aperture/shutter unit 103 to set an appropriate exposure amount. When the second switch SW2 is turned on, image data obtained from an optical image exposed on the image capturing unit 109 is stored in a storage unit 116.

When the moving image recording switch is pressed, moving image capturing is started, and when pressed again during recording, the recording ends. It is possible to also handle a still image capturing during a moving image recording by pressing the first switch SW1 and the second switch SW2 during moving image capturing.

When the playback mode selection switch is pressed, a playback mode is selected. Note that the image stabilization operation is stopped when in the playback mode.

The magnification/reduction switch is a switch for making an instruction for a zoom magnification/reduction. When the zoom magnification/reduction instruction is made by the magnification/reduction switch, the zoom driving control unit 102, after receiving the instruction via the camera system control unit 118, drives the zoom unit 101 to cause the zoom unit 101 to move to the instructed zoom position. Together with this, the focus driving control unit 108 drives the focus unit 107 to perform a focus adjustment based on image information that was sent from the image capturing unit 109 and that is processed in the image signal processing unit 110 and the video signal processing unit 111.

The storage unit 116 stores various data such as video information. A camera shake detection unit 117 is an angular velocity sensor that uses a sensor such as a gyro sensor to detect a camera shake amount as an angular velocity, and that outputs a shake signal (angular velocity signal) that is a conversion into a voltage. The camera system control unit 118 controls the image capturing apparatus overall. A motion vector detection unit 119 analyzes the shake between frame images of the video signal outputted from the image signal processing unit 110 to detect motion vectors.

Figure 2:
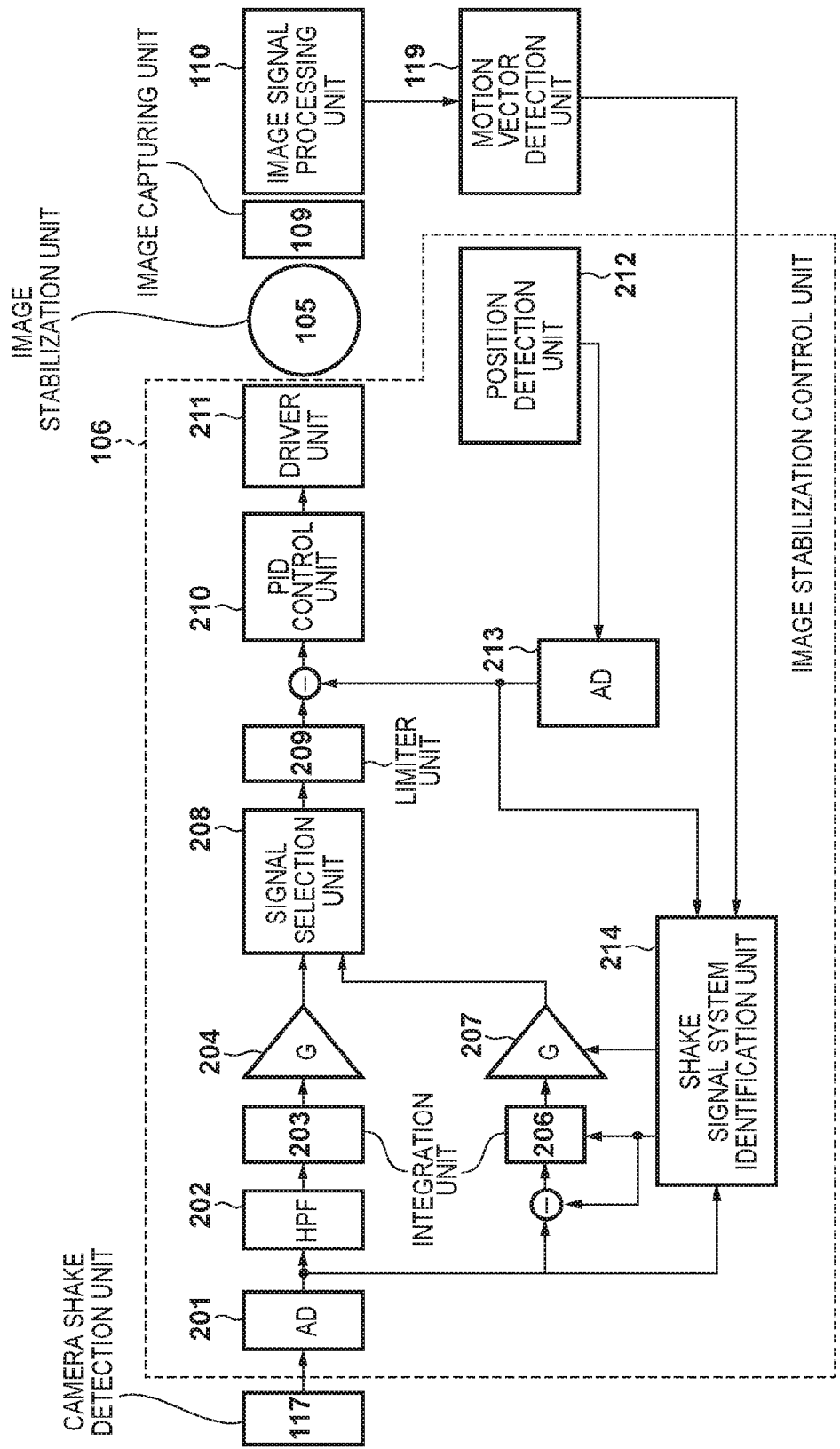
FIG. 2 is a block diagram illustrating a configuration of an image stabilization control unit according to a first embodiment.

FIG. 2 is a block diagram illustrating a configuration of the image stabilization control unit 106 according to the first embodiment. Note that description is only given for one image stabilization axis because the configurations are the same for a pitch direction and a yaw direction.

In FIG. 2, an AD conversion unit 201 converts an analog angular velocity signal that the camera shake detection unit 117 outputs into a digital angular velocity signal.

A high pass filter (HPF) 202 removes an offset component of the camera shake detection unit 117 and a temperature drift component from the angular velocity signal converted by the AD conversion unit 201. An integration unit 203 converts an angular velocity signal outputted from the HPF 202 into angular data by integrating by a pseudo integral using a low-pass filter (LPF) mainly. A multiplication unit 204 converts angular data obtained by the integration unit 203 into a drive amount of a correction lens included in the image stabilization unit 105. A sensitivity of the multiplication unit 204 is made to be a value that differs for each focal length, and whenever the focal length changes, the sensitivity also changes. Also, a correction amount according to a sensitivity adjustment of the angular velocity sensor of the camera shake detection unit 117 is also reflected, and absorbs sensitivity variation. Hereinafter this signal output will be referred to as a first camera shake correction amount.

Meanwhile, an integration unit 206 integrates an angular velocity signal, from which the offset value identified by a shake signal system identification unit 214 which will be described later is removed, by a pseudo integral using a low-pass filter mainly to convert it into angular data. A multiplication unit 207 has a similar configuration to the multiplication unit 204, and converts angular data that is obtained from the integration unit 206 into a drive amount of the correction lens. Hereinafter this signal output will be referred to as a second camera shake correction amount. Since this second camera shake correction amount does not pass through the HPF in contrast to the first camera shake correction amount, a compensation of a shake including a shake of a lower band than the first camera shake correction amount becomes possible.

A signal selection unit 208 selects either the first camera shake correction amount or the second camera shake correction amount. For example, to improve the appearance of video during moving image capturing having significant camerawork such as prior to still image capturing or a panning operation, the first camera shake correction amount whose band is narrower is selected. On the other hand, to increase an image stabilization effect during a still image exposure or during moving image capturing other than for a panning operation, the second camera shake correction amount which is a wide band signal is selected.

A position detection unit 212 detects a position of the correction lens and outputs it as a voltage, and an AD conversion unit 213 converts the analog voltage that is the position of the correction lens (position signal) into a digital position signal.

A limiter unit 209 clamps the first or second camera shake correction amount selected by the signal selection unit 208 into a range in which the image stabilization unit 105 which includes the correction lens can move. A PID control unit 210 inputs a signal that takes the difference of the position signal, which indicates the position of the correction lens outputted from the AD conversion unit 213, from the camera shake correction amount clamped by the limiter unit 209, and outputs a control signal for controlling the position of the correction lens based on the inputted difference signal. A driver unit 211 converts the control signal into a voltage, and supplies current for driving the image stabilization unit 105.

Three signals—the angular velocity signal outputted from the AD conversion unit 201, the position signal indicating the correction lens position outputted from the AD conversion unit 213, and a motion vector outputted from the motion vector detection unit 119—are inputted into the shake signal system identification unit 214. The shake signal system identification unit 214, from the three pieces of inputted data, performs a total of four calculations for the angular velocity sensor offset and sensitivity, and respective error diffusion values thereof. Then, in accordance with the result of these calculations, it changes the offset value that is subtracted from the angular velocity signal, an integration filter characteristic in the integration unit 206, and a gain for conversion into a shift amount of the correction lens in the multiplication unit 207.

Figure 3:
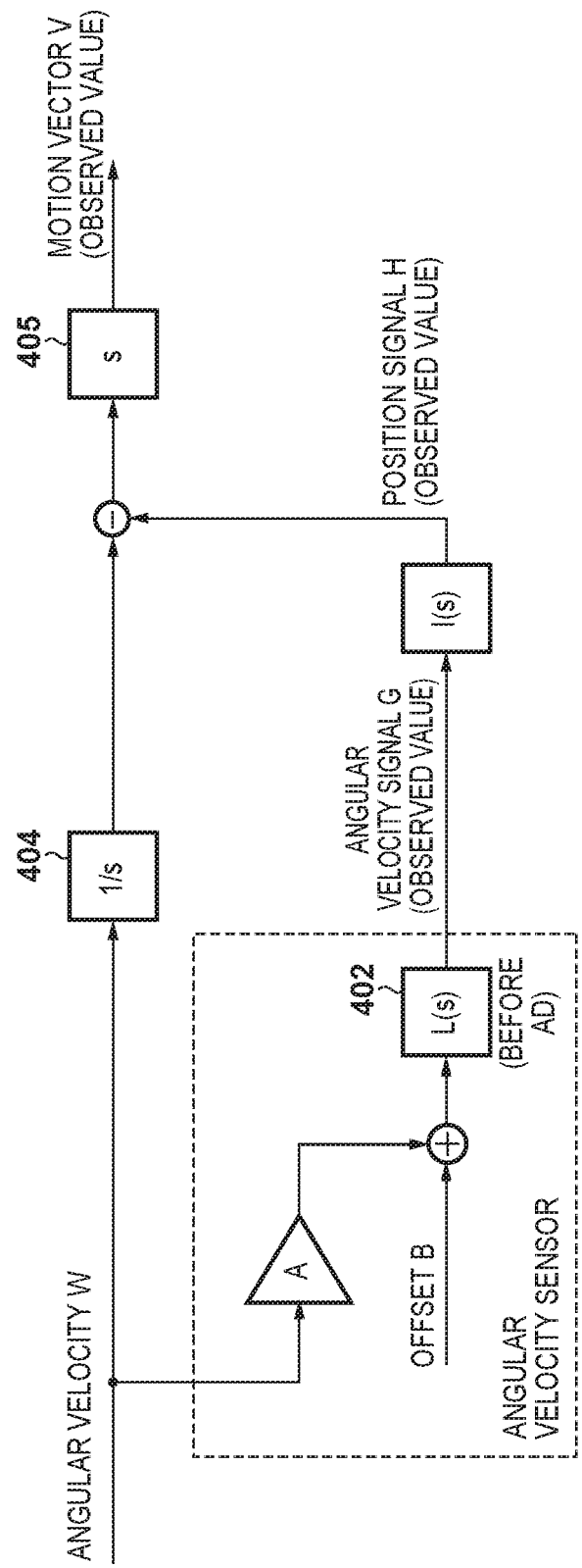
FIG. 3 is a view for describing a method for identifying an offset and a sensitivity of an angular velocity sensor from an angular velocity signal, a position signal, and a motion vector.

Next, the principle for identifying the angular velocity sensor offset and sensitivity simultaneously from the angular velocity signal, the position signal, and the motion vector is described using FIG. 3.

In a case where an angular velocity W in the image capturing apparatus is applied, in the angular velocity sensor incorporated in the image capturing apparatus, a sensitivity fluctuation A is multiplied, and an offset noise B which is an individual variation component of the angular velocity sensor is added to it when converting the angular velocity W into an angular velocity signal. Furthermore, high frequencies are cut by an LPF 402 from the output thereof and an observed value (angular velocity signal) G is thereby detected. Here, a characteristic of the LPF 402 is expressed as L(s), where s is a complex number used in a Laplace transform. Note that in FIG. 3, the LPF 402 is illustrated inside the angular velocity sensor, but it is the same even if it is external to the angular velocity sensor.

The angular velocity signal G is converted into a drive amount for the correction lens by the image stabilization control unit 106. Here, a conversion characteristic of the image stabilization control unit 106 is expressed as I(s). This drive amount will be observed as a position signal H which is detected by the position detection unit 212.

Meanwhile, although the angular velocity W in the image capturing apparatus by a simple integration (404) becomes the true shake angle of the overall image capturing apparatus, this signal cannot be observed. When the position signal H is subtracted from the shake angle of the overall image capturing apparatus it becomes a remaining shake angle, and a difference between frames (405) of this remaining shake angle is obtained as a motion vector V by the motion vector detection unit 119.

A transfer characteristic from the angular velocity W to the motion vector V of FIG. 3 can be expressed by Equation (1) below.

$$V = W - sH \quad (1)$$

Also, the transfer characteristic from the angular velocity W to the angular velocity signal G of FIG. 3 can be expressed by Equation (2) below.

$$G = L(s)(AW + B) \quad (2)$$

Equation (3) corresponds to when the actual angular velocity W that cannot be observed is removed from the above described Equations (1) and (2).

$$G = AL(s)(sH + V) + L(s)B \quad (3)$$

Also, because the frequency band of the camera shake is normally 20 Hz or less, and it is mainstream that the cutoff frequency of the LPF 402 of the angular velocity sensor be several 100 Hz, here it is possible to approximate that L(s)×1. In such a case, Equation (3) becomes the following Equation (4).

$$G = A(sH + V) + B \quad (4)$$

Up until this point a continuous system has been described, and next, a discrete system will be described.

Let the angular velocity signal G(k) be y(k) (G on the left side of Equation (4)), ΔH(k)+V(k) be x(k) (sH+V on the right side of Equation (4)), and the identification parameter be $\theta(k)^T = (A(k), B(k))$. A(k) is the sensitivity of the angular velocity sensor, B(k) is the offset of the angular velocity sensor, and k is the discrete time.

$$y(k) = G(k) \quad (5)$$
$$x(k) = \Delta H(k) + V(k)$$

$$\theta(k) = \begin{pmatrix} A(k) \\ B(k) \end{pmatrix}$$

Also, a new variable z(k) is defined as follows.

$$z(k) = \begin{pmatrix} x(k) \\ 1 \end{pmatrix} \quad (6)$$

From Equations (4), (5), and (6), it is possible to derive the following state equation.

$$\theta(k+1) = \theta(k) + \varepsilon$$
$$y(k) = \theta(k)^T z(k) + \omega \quad (7)$$

where ω is a system noise parameter expressing a fluctuation component of the identification parameter, and ω is a observed noise parameter.

As can be seen from Equation (7), the offset and the sensitivity of the angular velocity sensor which are the identification parameter that can be expressed as a state variable can be identified from 3 pieces of data—the angular velocity signal G(k), the position signal H(k), and the motion vector V(k)—which are the observed amounts. Also, by designing ε, which is the system noise parameter, appropriately, it is possible to make an identification including temperature fluctuation component of the angular velocity sensor sensitivity and the angular velocity sensor offset.

Also, filtering steps for identifying θ of Equation (7) using a Kalman filter are as follows.

(Step 1) Kalman Gain Calculation $$K(k) = \frac{P(k) \cdot z(k)}{\sigma_\omega^2 + z^T \cdot P(k-1) \cdot z(k)} \quad (8)$$

(Step 2) Identification Parameter Calculation $$\theta(k) = \theta(k-1) + K(k)\{y(k) - z^T(k) \cdot \theta(k-1)\} \quad (9)$$

(Step 3) Identification Error Diffusion Calculation $$P(k) = P(k-1) - \frac{P(k-1) \cdot z(k) \cdot z^T(k) \cdot P(k-1)}{\sigma_\omega^2 + z^T \cdot P(k-1) \cdot z(k)} + R_\varepsilon \quad (10)$$

where k is discrete time (the filtering step number), K is Kalman gain (1 row×2 columns), P is the identification error covariance matrix (2 rows×2 columns), and $\sigma_\omega$ is an observed noise diffusion parameter (scalar amount) for the angular velocity signal. Also, $R_\varepsilon$ is a system parameter (2 rows×2 columns) that considers the temperature fluctuation of the identification parameter. For the initial value of the identification error diffusion matrix P, an appropriate large value is given as a design value. However, if a value that is very large is set, the identified result will diverge, so tuning in accordance with observed noise is required for this parameter.

Also, for $\sigma_\omega$, an actual observed noise value for the angular velocity signal may be used, but, as can be seen from Equations (8) and (10), the larger this parameter is, the slower the identification convergence is, and the smaller it is, the faster the convergence is. Meanwhile, a larger value will stabilize the filter, while the smaller it is, the more there is a risk that the identification result will diverge. For this reason, it can be also considered to be a tuning parameter for deciding the convergence speed of the filter.

Meanwhile, in step 3 (Equation (10)) in the Kalman filter, identification error diffusion is also simultaneously calculated. This is a value that is an indicator that indicates how much the identification result θ(j) varies from k=0 to k=j for a given time j, and can be considered to be a value that corresponds to the reliability of the identification parameter θ at the time j.

As described above, the identification parameter θ converges moment by moment and the reliability increases, but it is similar even if a recursive least-squares method is used rather than a Kalman filter. However, with a recursive least-squares method, observed noise and system noise (identification parameter fluctuation components) are not considered, and so filtering robustness is lower, and also it is not applicable to parameter temperature fluctuation, so the identification value will converge to a constant value. For this reason it is advantageous to use a Kalman filter in an actual design.

Above is a detailed description of a method for identifying a sensitivity fluctuation A of an angular velocity sensor and an offset B of the angular velocity sensor, but a simplified description is as follows.

By Equation (4), when the angular velocity signal G which is an observed value is y, and sH+V which is a sum of the image stabilization angular velocity and the motion vector is x, Equation (4) becomes a simple linear model y=Ax+B, and the slope A and the y intercept B of the straight line y=Ax+B may be determined from observed values. The slope is the sensitivity of the angular velocity sensor, and the y intercept is the offset of the angular velocity sensor.

Note that the sensitivity of the angular velocity sensor obtained by the above described method, if the subject distance corresponds to infinity, is the pure angular velocity sensor sensitivity, but this is not the case if the subject distance is a short distance. There are two types of shake in an image capturing apparatus: angular shake and translational shake. Equation (11) expresses the shake amount on the imaging plane.

$$\delta=(1+\beta)f\theta(t)+\beta y(t) \quad (11)$$

where δ is the shake amount [mm] on the imaging plane, β is the imaging magnification factor, f is the focal length [mm], θ(t) is the shake angle [deg], and y(t) is the drive amount [mm]. $(1+\beta)f\theta(t)$ on the right side of Equation (11) is the angular shake component, and $\beta y(t)$ on the right side is the translational shake component.

As can be seen from Equation (11), in the case where the subject distance is short, that is in the case of macro imaging, the imaging magnification factor β is large, and therefore the translational shake component cannot be ignored. In such a case, in many prior examples, the drive amount y(t) which is an element of the translational shake component is sensed by an acceleration sensor, a translational shake correction amount is computed separately, and by combining it with the angular shake component obtained by the angular velocity signal, both shake components are corrected. However in an identification method of the present invention, remaining translational shake is detected as a motion vector if the subject distance is close, and therefore a correction sensitivity including the translational shake component is identified. That is, by using the above described identification method, it becomes possible to identify the total gain of both shake components—the angular shake and the translational shake—without using an acceleration sensor, and cancel the shake.

However, in the case where sensitivity fluctuation that considers the translational shake component is calculated, it is necessary to design $R_\epsilon$, which is a system fluctuation component parameter, appropriately. Also, if the subject distance fluctuates by a predetermined value or greater, in order to increase the convergence speed of the identification parameter thereafter, it is necessary to reset the identification error diffusion to an initial value, or to make $R_\epsilon$, which is the system noise, larger.

Figure 4:
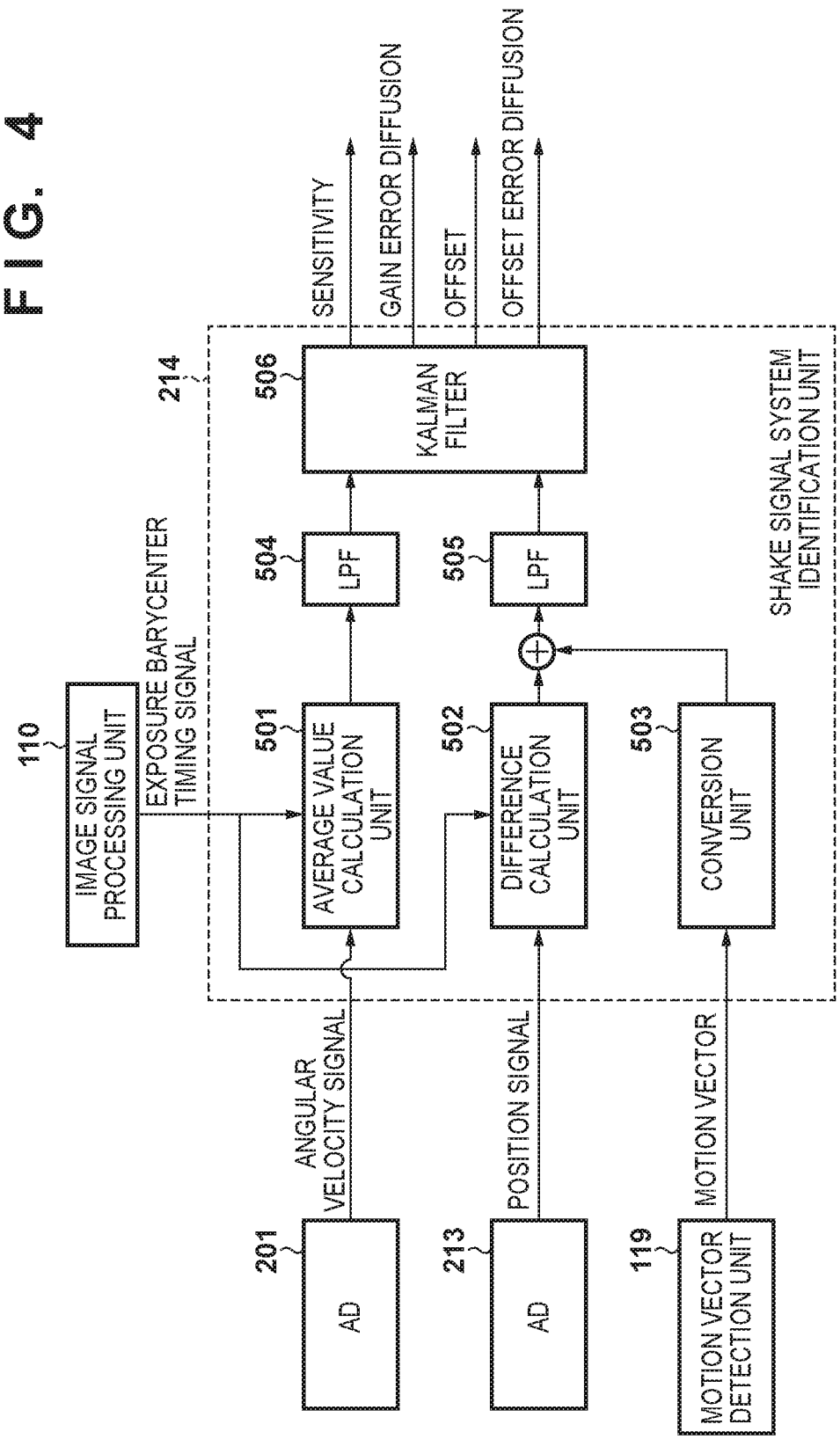
FIG. 4 is a block diagram illustrating a configuration of a shake signal system identification unit according to the first embodiment.

Next, using FIG. 4, the configuration of the shake signal system identification unit 214 will be described. Sampling of a shake signal system identification process is performed at 30 Hz or 60 Hz which is for motion vector sampling that is the slowest among sampling the observed data. The angular velocity signal and the position signal are sampled at a rate of a few kHz in the AD conversion units 201 and 213, and an imaging exposure barycenter timing signal is used to synchronize with the motion vector. With this, the average values between frames between exposure barycenters of the angular velocity signal are calculated in an average value calculation unit 501, and an image stabilization angular velocity between frames is calculated from a difference between exposure barycenters of position signals in a difference calculation unit 502. Also, the motion vector, in a conversion unit 503, is converted to a motion vector in angular velocity units, and is added to the image stabilization angular velocity between frames. The respective signals are inputted into LPFs 504 and 505 to reduce aliasing. Then by inputting te output of the LPFs 504 and 505 into a Kalman filter 506, the offset and the sensitivity of the angular velocity sensor are identified. Identification error diffusions which indicate the reliability of the identification results are also simultaneously outputted.

Figure 5:
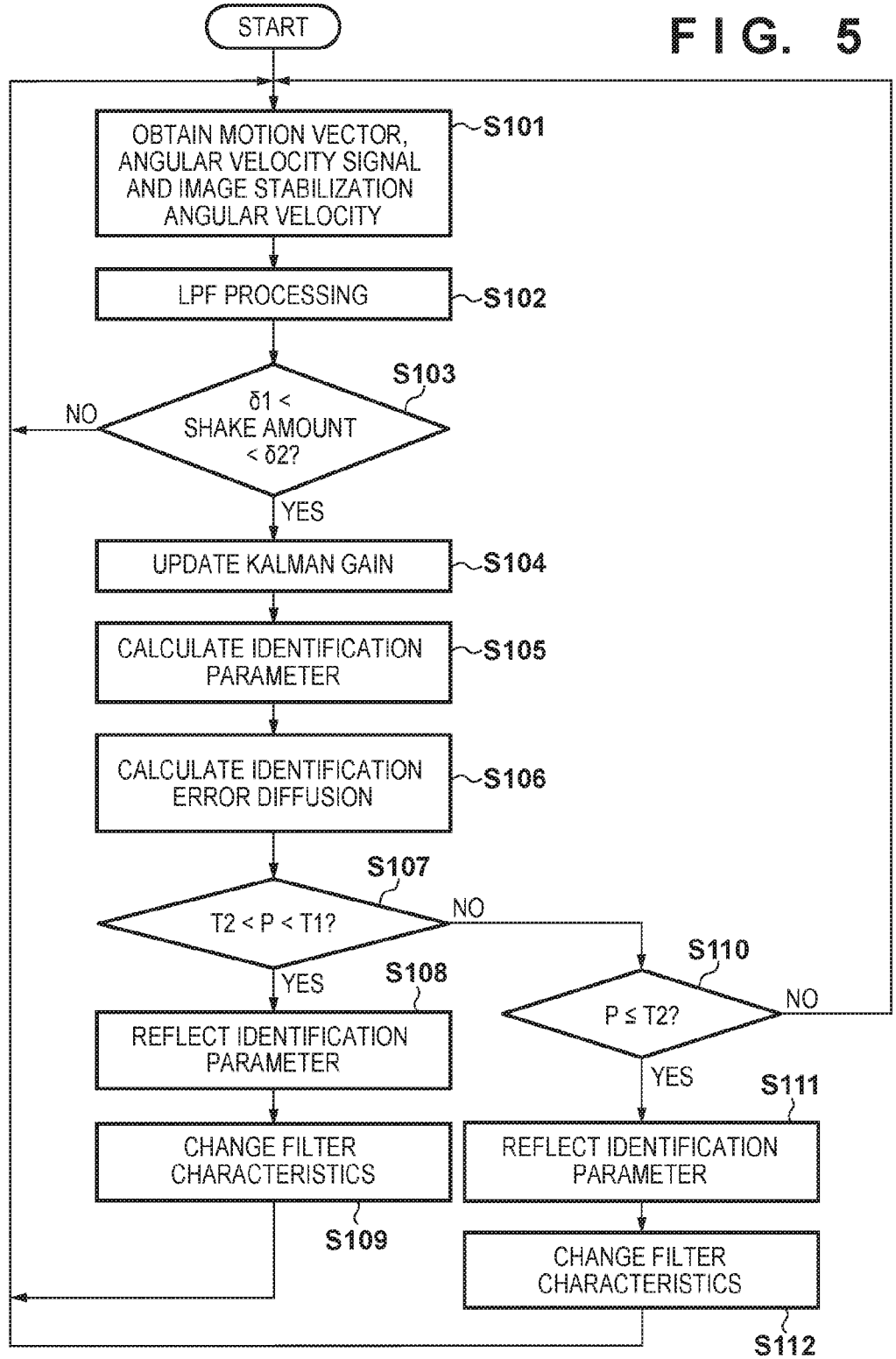
FIG. 5 is a flowchart of a shake signal system identification process according to the first embodiment.

Next, the shake signal system identification process is described using the flowchart of FIG. 5.

First, in step S101, the three pieces of observed data—the motion vector, the angular velocity signal, and the image stabilization angular velocity—are obtained. Note that the angular velocity signal is an average value between exposure barycenters, and the image stabilization angular velocity is a differential value of image stabilization angles between position signal exposure barycenters. Also, at this stage, the unit system for these three pieces of observed data are aligned. In step S102, low-pass filter processing for anti-aliasing by LPFs 504 and 505 is performed.

Next, in step S103, the motion of the image capturing apparatus is determined. In a case where the shake is small, that is in a case where the image capturing apparatus is attached to a tripod, in a case where it is placed on a base where there is no shake and is in a stationary state, or the like, the three pieces of observed data are substantially constant values. In such cases, a correct identification cannot be made because the observation reference point is fixed when the above described Kalman filter steps are executed. Rather the identification result precision is lower because it is influenced by observed data noise. This is because the S/N ratio is bad. In the case where conversely the shake is large, that is in the case of quickly panning the image capturing apparatus, in the case of walking or running while holding the image capturing apparatus, or the like, the precision of the motion vector is lower. Typically, the motion vector detection range is narrower than with the angular velocity sensor, and a large angular velocity cannot be detected. Also, there are cases in which, for a large shake, the image captured in the imaging itself is blurred, and a correct motion vector cannot be detected.

Additionally, for a large shake, there is the possibility that the motion vector will be deformed due to the following two causes. The first is when a shake in a Roll direction of the image capturing apparatus, which is one of the shake components, is superimposed as noise on motion vectors in the Pitch direction and the Yaw direction, and the motion vector detection results for the Pitch/Yaw directions are deformed. This is particularly noticeable in cases of imaging while walking or imaging while running. Regarding the second, in the case where the image capturing apparatus uses a rolling shutter, there is a corresponding distortion component superimposed on the motion vectors in the Pitch/Yaw directions. This is particularly noticeable in the case of a large enough shake that a correction limitation of an optical image stabilization apparatus is exceeded.

Only in cases when, due to such causes, the shake amount observed in step S103 is larger than the predetermined value δ1 determined in advance, and is smaller than a predetermined value δ2 determined in advance (within a range determined in advance), the processing proceeds to step S104, and otherwise the processing returns to step S101. Note that the shake amount may be the angular velocity signal itself, or may be a sum of the motion vector and the position signal (a model angular velocity). Step S104, step S105, and step S106 are filtering steps according to the Kalman filter, and processing corresponding to the above described Equation (8), Equation (9), and Equation (10) is performed therein respectively.

From step S107, it is determined to what degree a parameter identification value which is the Kalman filter computation result converges. In step S107, it is determined whether or not the identification error diffusion P(k) is between the predetermined values T1 and T2, and if it is between these, the identification parameter is reflected in the image stabilization control unit 106 (step S108). Furthermore, after changing (step S109) an LPF filter characteristic of the integration unit 206 in a direction in which the characteristic is good, the processing returns to step S101.

In step S107, if the identification error diffusion P(k) is not between the predetermined values T1 and T2, it is determined in step S110 whether the identification error diffusion P(k) is less than or equal to the predetermined value T2. If it is less than or equal to the predetermined value T2, the identification parameter is reflected in the image stabilization control unit 106 (step S111), and the LPF filter characteristic of the integration unit 206 is further changed (step S112) in a direction in which the characteristic is better than (a direction in which the cutoff frequency is lower) in step S109. Note that in the processing illustrated in FIG. 5, due to the space of the paper only two patterns for determining the reliability of the identification result are recited, but more patterns may be prepared. In such cases, the filter characteristic is changed in a direction in which the characteristic is better (a direction in which the cutoff frequency is lower) when the identification error diffusion P(k) is lower than a predetermined value.

By virtue of the first embodiment as described above, it is possible to identify the sensitivity and offset of the angular velocity sensor precisely, and it is possible to improve an image stabilization effect because it is possible to reflect the identified sensitivity and offset in the camera shake correction amount.

Note that when changing the filter characteristic in step S109 and in step S112, if a LPF for performing a pseudo integral is designed with an IIR-type filter, it is advantageous to, in accordance with the time from activation of the image capturing apparatus to the timing of the filter characteristic change, simultaneously change Z which is an intermediate variable. Typically, in cases where successive computation filter processing is performed by a CPU, it is thought that an IIR-type filter will often be used because of the processing load.

Figure 6:
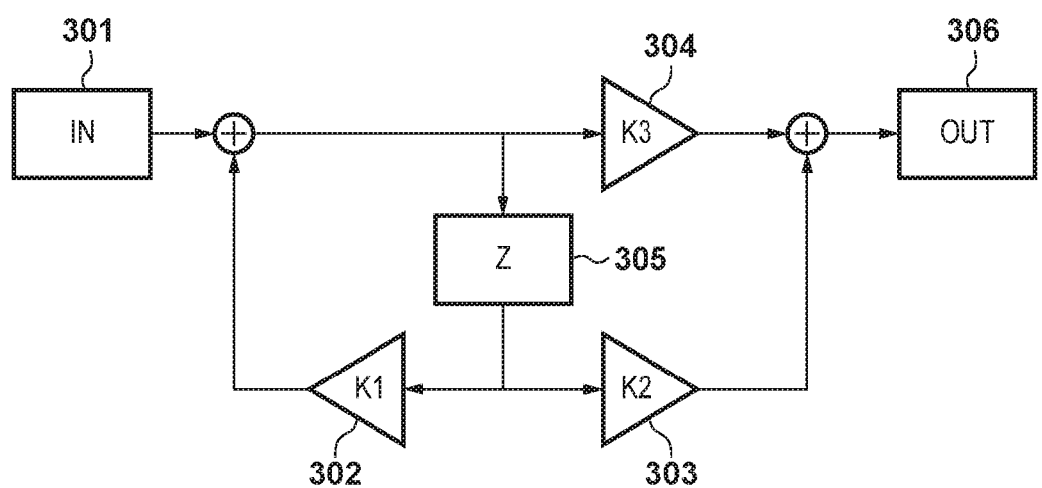
FIG. 6 is a block diagram illustrating a configuration of a typical first order IIR filter.

Next, the intermediate variable Z will be described using FIG. 6. FIG. 6 is a block diagram of a typical first order IIR filter (LPF). In FIG. 6, an input IN is inputted from a signal input unit 301, and a filter processed output OUT is outputted from a signal output unit 306. The cutoff frequency of the LPF, that is the band of the LPF, is determined by a coefficient K1 of a coefficient multiplication unit 302. Also, coefficients K2 and K3 of coefficient multiplication units 303 and 304 are coefficients for deciding the gain of LPF output, and in the case of an LPF, K2=K3. In the pseudo integral, an integration gain which is the output gain is fixed, and does not change even if a characteristic is changed. By making the coefficient K1 larger in the case of changing a characteristic, a low-frequency component characteristic of an integration characteristic is improved. In relation to this, the filter intermediate variable Z (305) can be expressed by Equation (12) below. Note that n is the number of steps in Equation (12).

$$Z_{(n+1)} = K1 \times Z_n + IN \quad (12)$$

Since the intermediate variable Z depends greatly on the coefficient K1, and the output from the signal output unit 306 is decided by this value, it greatly influences the performance of the image stabilization.

Because the intermediate variable Z also depends on the number of steps n, it is necessary that the time from activation of the image capturing apparatus until the change of the filter characteristic be measured, and the intermediate variable Z be calculated precisely in accordance therewith to make the change. However, if the number of steps n is sufficiently large, the intermediate variable Z is approximately independent of the number of steps n, and so that is not the case.

However, there may be cases in which the intermediate variable Z cannot be obtained precisely within an expected time depending on CPU processing performance. Because a discontinuity of the signal will occur and the angle of view of image capturing apparatus will move sharply in the change if the precision is not good, the intermediate variable Z is not changed in the case where the second camera shake correction amount (output of the multiplication unit 207) is selected by the signal selection unit 208 of FIG. 2. It takes time for the convergence of the filter characteristic change, but no sharp angle of view fluctuation arises. This is a case where moving image stabilization performance is increased without panning or the like mainly when aiming during moving image capturing.

Meanwhile, when the signal selection unit 208 selects the first camera shake correction amount (output of the multiplication unit 204), even if the precision is not good, the intermediate variable Z is changed simultaneously, and a filter characteristic of the integration unit 206 is switched instantaneously. Because image stabilization by the first camera shake correction amount is in the middle of being executed, discontinuity of the second camera shake correction amount is not apparent in the image. These are situations made to be the object of the present invention prior to still image capturing.

<Variation>

In the foregoing first embodiment, description of a case in which a motion vector can be detected normally is given, but considering actual environment and camera usage conditions, it can be considered that there will be cases in which the motion vector cannot be detected, or while it can be detected, reliability is low. A case where it cannot be detected is when the image sensor is not activated when, for example, the camera is used in a playback mode, and images that were imaged in the past are being browsed. Also, a case in which the reliability of the motion vector is low is when, for example, the subject that the camera captured is low-contrast, or is a repeating pattern, or the like. If a motion vector cannot be detected, necessarily identification processing cannot be executed. Meanwhile, if the reliability of the motion vector is low, there is a possibility that the identification precision will be reduced due to the value of the motion vector, and so it is advantageous to not execute identification processing.

However, if the time over which the identification processing has not been executed continues for fixed interval or more, output variation itself for the angular velocity signal identified in that period will fluctuate. When the image stabilization is executed with the output variation that fluctuated being reflected as is, the performance of the image stabilization will worsen. Therefore, if the foregoing situation arises, the filter characteristic of the integration unit 206 is returned to was it was originally (the band is made to be narrow), and the identification error diffusion value is reset to an initial value. By this, it is possible to avoid deterioration of image stabilization performance. Also, when a motion vector can be detected, and a high reliability state is returned to, the value of the identification error diffusion is large, and so it is possible to rapidly re-identify the output variation portion of the angular velocity signal that fluctuated.

Figure 7:
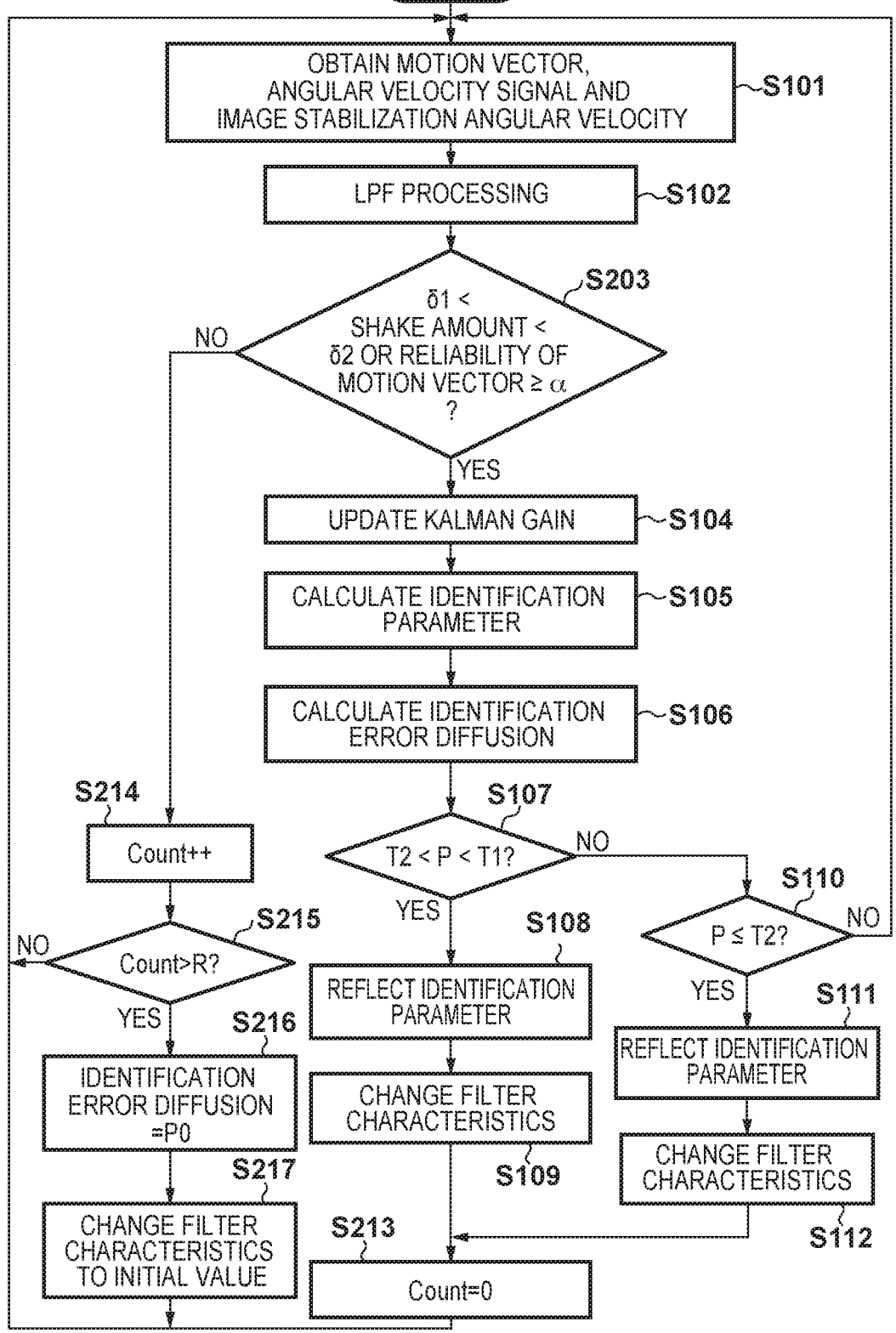
FIG. 7 is a flowchart of a shake signal system identification process according to a variation of the first embodiment.

The foregoing processing is described using the flowchart of FIG. 7. Note that for processing that is similar to FIG. 5, the same step numbers are given, and description is omitted. The difference with FIG. 5 is that first, in step S203, the reliability of the motion vector is further determined together with the shake amount. If, in this determination, the determination to not execute identification processing is made, transition is made to step S214. In step S214, the time period over which identification processing has not been executed is counted. In step S215, it is determined whether the counted value is larger than a predetermined value R. If it is less than or equal to the predetermined value R, the processing returns to step S101. Meanwhile, if it is greater than the predetermined value R, it is determined that the time period over which the identification processing has not been executed has continued for a predetermined duration, and the identification error diffusion at that time is reset to an initial value P0 in step S216. Furthermore, in step S217, the filter characteristic of the integration unit 206 is returned to an initial value (a band is narrower than the filter characteristic set in step S109 or in step S112). After that the processing returns to step S101. Note that the value counted in step S214 is reset in step S213 when the identification processing is executed even a single time.

Next, an image capturing apparatus comprising a zoom lens capable of changing focal length is assumed. Because the angle of view is wider if the focal length is shorter, the angle corresponding to one pixel is larger, and the motion vector detection resolution capability is less. Conversely, because the angle of view is narrower if the focal length is longer, the angle corresponding to one pixel is smaller, and the motion vector detection resolution capability is greater. That is, the variation of the detected motion vector fluctuates in accordance with the focal length. Accordingly, when a parameter of the Kalman filter in the identification processing is made to be fixed, variation occurs in the identification precision in accordance with the focal length.

In view of this, by changing the observed noise diffusion parameter $\sigma_\omega$, which is a parameter in Equation (8), the identification convergence speed changes, but identification precision worsening is prevented. More specifically, by making a, larger if the focal length is shorter, the convergence speed becomes slower, and the identification precision is kept from worsening. Conversely, by making a, smaller if the focal length is longer, it is possible to keep the convergence speed fast, and the identification precision high.

Also, the influence of a disturbance is considered. A cause of a disturbance when the image capturing apparatus is shaken significantly is as described previously, and it was recited that the identification processing sequence is not entered when there is a significant shake. Conversely, a situation in which it can be considered that there will be little cause for a disturbance is when a user captures a subject, and is holding SW1, and so in such a case, there is a high possibility that there will be no significant shaking. Also, there is a low possibility that a motion vector whose reliability is low, such as in the case of low-contrast, has been detected after becoming in-focus following an auto focus. In such a case, it can be considered that the identification precision will increase by relatively raising the identification convergence speed.

More specifically, after focusing while holding SW1, the Kalman gain is made to be larger by making the observed noise diffusion parameter $\sigma_\omega$ of Equation (8) relatively smaller, and thereby the identification convergence speed is raised. Also, by simply raising the frame rate of the image sensor, the identification convergence speed is raised. By this, it is possible to further raise the identification precision in high speed identification processing in which a cause of a disturbance is reduced.

Second Embodiment

Next, a second embodiment of the present invention is described. In the foregoing first embodiment, a case in which a position of the correction lens of the image stabilization unit 105 can be detected by the position detection unit 212 is described, but in the second embodiment, a case in which the position detection unit 212 does not exist, and image stabilization is performed by open control is described. Note that the configuration of the image capturing apparatus in the second embodiment is similar to that which was described with reference to FIG. 1 in the first embodiment, and description is omitted.

Figure 8:
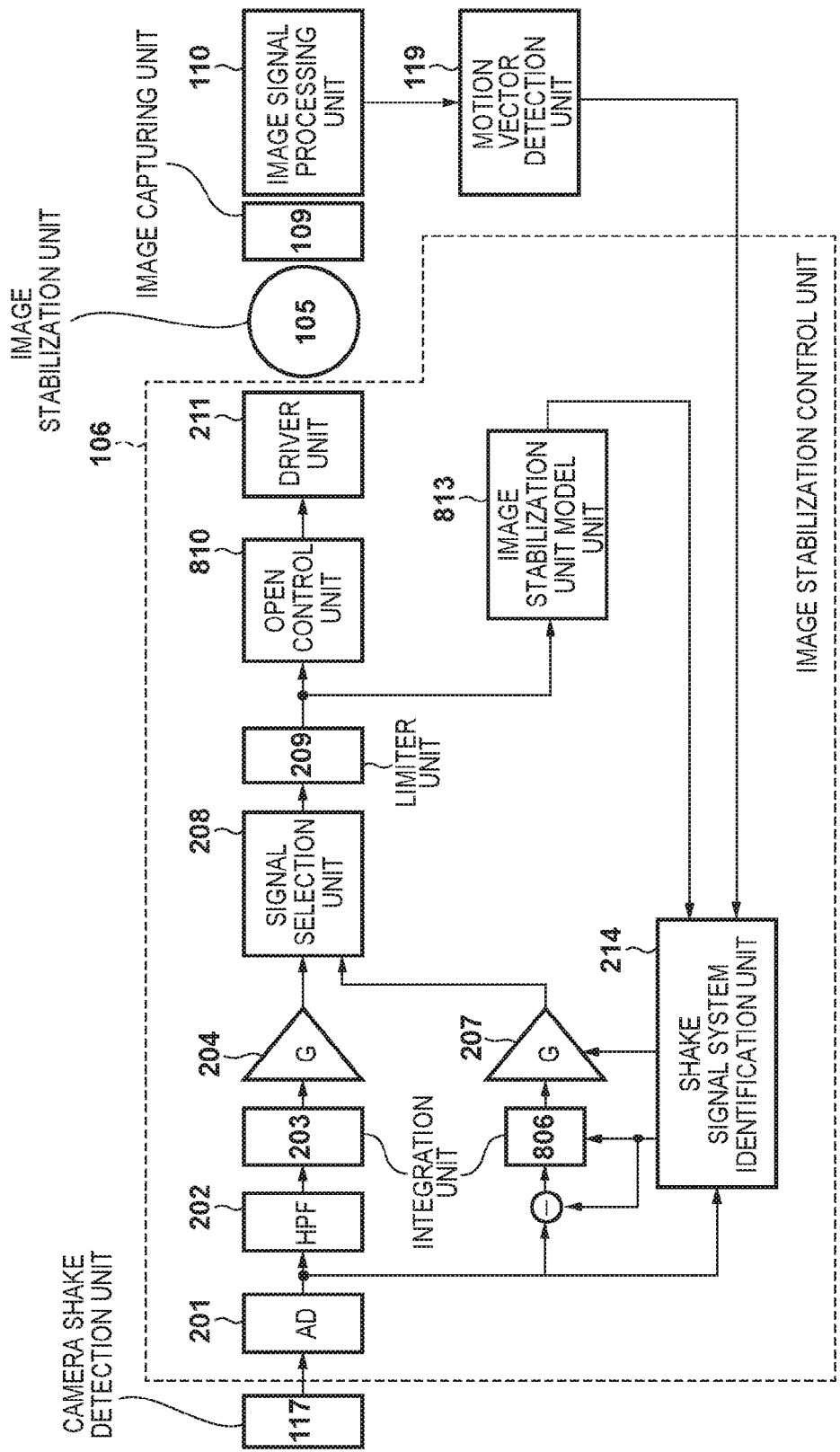
FIG. 8 is a block diagram illustrating a configuration of an image stabilization control unit according to a second embodiment.

FIG. 8 is a block diagram illustrating a configuration of the image stabilization control unit 106 in the case of open control according to the second embodiment. Note that for similar configurations to the configurations described in the first embodiment with reference to FIG. 2, the same reference numerals are given, and description is omitted as appropriate.

Because a position signal does not exist in open control executed by an open control unit 810, the position signal is predicted from the angular velocity signal in the second embodiment. An image stabilization unit model unit 813 define a mechanical model of the image stabilization control unit 106, and performs processing for predicting output (the position [m]) in relation to input thereto (input [N]). Using the position signal predicted by the image stabilization unit model unit 813, output variation of an angular velocity signal is identified in the shake signal system identification unit 214 together with the angular velocity signal and the motion vector similar to in the first embodiment.

Figure 9:
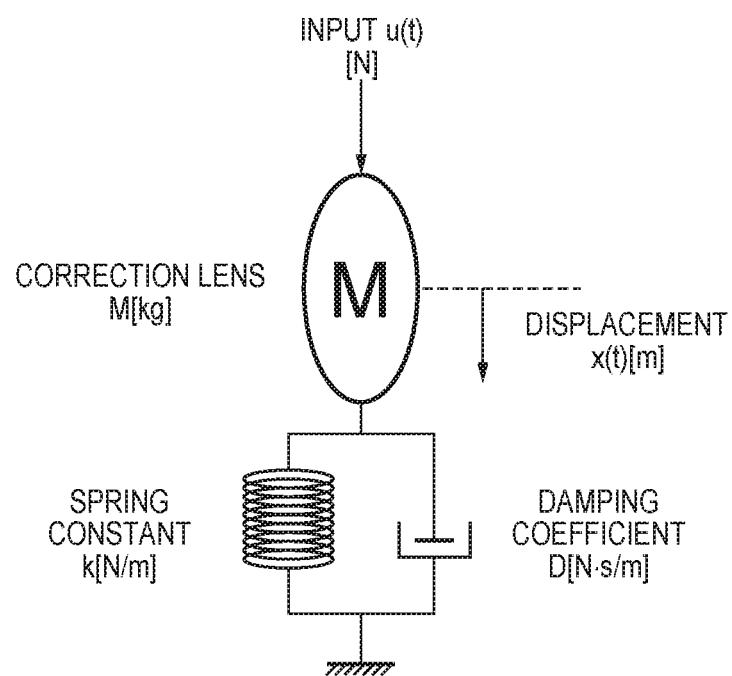
FIG. 9 is an explanatory view of an image stabilization unit according to the second embodiment.

Next, description is given for the image stabilization unit model unit 813. FIG. 9 is a view for simply representing the image stabilization unit model unit 813 in a second order spring mass damper model. Let a weight of a correction lens which is a movable unit of the image stabilization unit 105 be M [kg], a spring constant be k [N/m], a damping coefficient be D [N·s/m], a lens driving displacement amount be x(t) [m], and a force exerted on the lens be u(t) [N]. In such a case, Equation (13) below holds true according to an equation of motion.

$$M\frac{d^2x(t)}{dt^2} + D\frac{dx(t)}{dt} + kx(t) = u(t) \tag{13}$$

When the foregoing equation is Laplace transformed, and the control target is represented by a transfer function, the following Equation (14) holds. H(s) is a transfer function of a mathematical model of the image stabilization unit 105 which is the control target.

$$H(s) = \frac{1}{Ms^2 + Ds + k} \tag{14}$$

By this, the image stabilization lens is approximated as a second order control target, and the transfer characteristic is expressed.

The force u(t) exerted on the lens here is a composition of a lens drive command signal r(t) [N] outputted from the driver unit 211, and a force d [N] according to acceleration disturbance, and the following Equation (15) holds.

$$u(t)=r(t)+d(t) \tag{15}$$

The disturbance d[N] may be compensated using an acceleration sensor.

By the above, the position signal is predicted, and similarly to the first embodiment, by inputting the predicted position signal, angular velocity signal, and motion vector into the shake signal system identification unit 214, it is possible to identify the sensitivity and the offset of the angular velocity sensor.

Third Embodiment

Next, a third embodiment of the present invention is described. In the third embodiment, a panning shot assistance function for capturing while tracking a moving subject is described.

Typically, a setting of a shutter speed Tv for making a background flow by in a panning shot is set to be slow, but the slower it is made to be, the more a shift between a movement of an actual subject and a panning speed of the image capturing apparatus will remain as a blur of the subject. Accordingly, a function that causes a blur of a subject to be cancelled by driving an image stabilization unit at a speed that is the difference between the actual movement speed of subject and the speed of the image capturing apparatus is a panning shot assistance function.

For this, it is necessary to detect the speed of the subject using a motion vector. For the motion vector, a local motion vector is generated for each small block in a screen, and for each individual local motion vector, a background vector due to panning other than the subject vector is included. In this way, since there are two types of motion vectors, processing for separating the subject vector and the background vector becomes necessary.

Figure 10A:
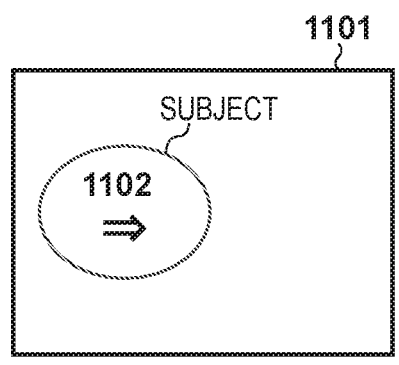
FIG. 10A and FIG. 10B are views illustrating a subject, and an example of a block arrangement for detecting a motion vector according to a third embodiment.
Figure 10B:
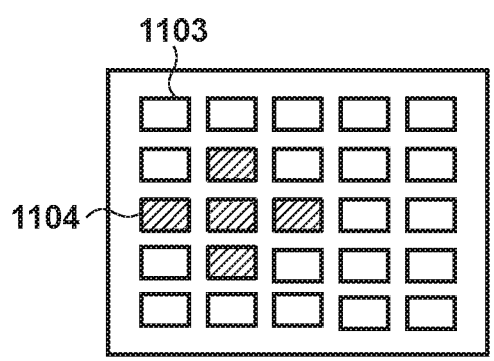

FIG. 10A is a view illustrating a case where there is a subject 1102 which moves in relation to a screen 1101. Also, FIG. 10B is a view in which regions (blocks) for detecting a local motion vector are arranged, and as an example, 5 vertical×5 horizontal blocks are illustrated. Also, the subject is assumed to move in a rightward direction, and a panning direction is also assumed to be made to be the rightward direction so that the subject can be tracked.

In such a case, a somewhat small shake amount is detected as a motion vector from the blocks (hatched blocks 1104) in which the moving subject is present. Meanwhile, from the remaining background blocks (non-hatched blocks 1103), a large motion vector that is aligned with the panning is detected. The panning speed of the latter matches a shake pixel amount of an image converted from the angular velocity signal which indicates the shake amount detected by the angular velocity sensor, and so a motion vector in the vicinity of the shake pixel amount is the background vector, and other motion vectors are separated as subject vectors.

Figure 11:
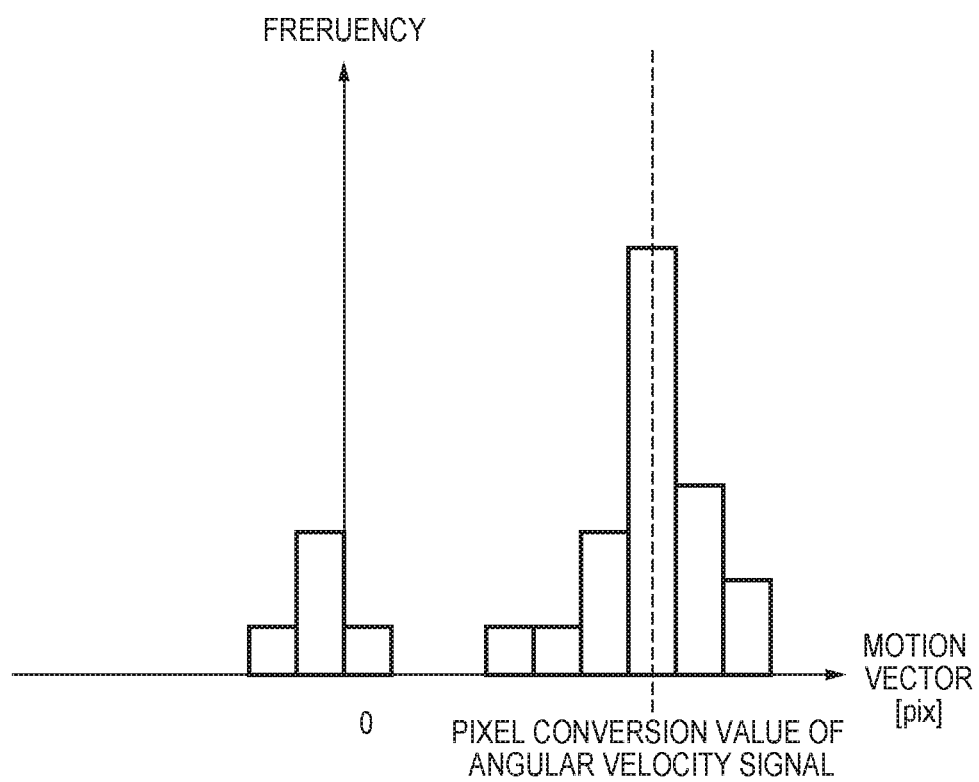
FIG. 11 is a view illustrating a histogram of a motion vector according to the third embodiment.

FIG. 11 is a histogram in which for local motion vectors obtained for each of the 5×5 regions, the sizes of the motion vectors are expressed on the abscissa axis, and frequency is expressed on the ordinate axis. The dashed line is a value for when the output of the angular velocity sensor is converted into a shake pixel of the image. As explained above, output of the angular velocity sensor and the background vector should match, and for a subject vector, it is ideal that there is as a shake pixel a peak that is separated therefrom.

However, actually, there is fluctuation due to temperature and specific offset noise for the angular velocity sensor, and because of the presence of sensitivity fluctuation due to sensitivity variation and temperature, the dashed line of FIG. 11 fluctuates influenced by this noise. For this reason, the larger the noise is, the more difficult it is to separate a background vector and a subject vector, and so panning shot assistance precision is also influenced.

Accordingly, in the third embodiment, the output of the angular velocity sensor and a motion vector are used to identify output variation of the angular velocity sensor, and separation of the subject vector and the background vector is performed by comparing the signal in which the identification result is reflected in the output of the angular velocity sensor with the motion vector.

Figure 12:
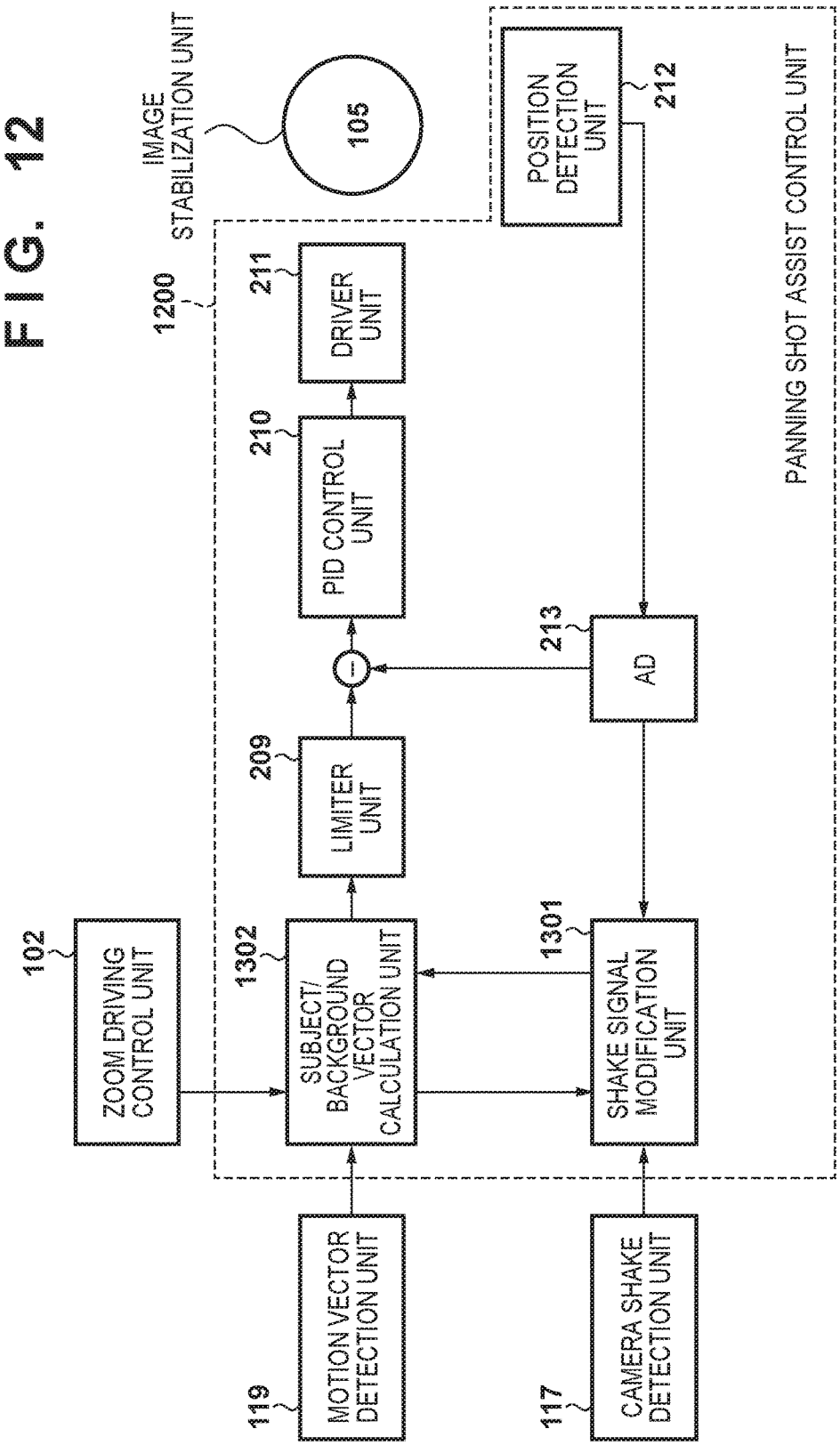
FIG. 12 is a block diagram illustrating a configuration of a panning shot assist control unit according to the third embodiment.

FIG. 12 is a block diagram illustrating a configuration of a panning shot assist control unit 1200 in the third embodiment. The panning shot assist control unit 1200 is configured in place of the image stabilization control unit 106, but configuration may use a partial configuration of the image stabilization control unit 106. Note that the configuration of the image capturing apparatus in the third embodiment is similar to that which was described with reference to FIG. 1 in the first embodiment aside from the panning shot assist control unit 1200, and so description is omitted. Also, for configurations in FIG. 12 having similar functions to those described with reference to FIG. 2 in the first embodiment the same reference numerals are given and description is omitted.

1301 is a shake signal modification unit, into which as input three observed values—a background vector, an angular velocity signal from the camera shake detection unit 117, and a position signal from the AD conversion unit 213—are input. 1302 is a subject/background vector calculation unit, which calculates a subject vector and a background vector using a shake signal modified by a shake signal modification unit 1301 and a plurality of motion vectors.

Figure 13:
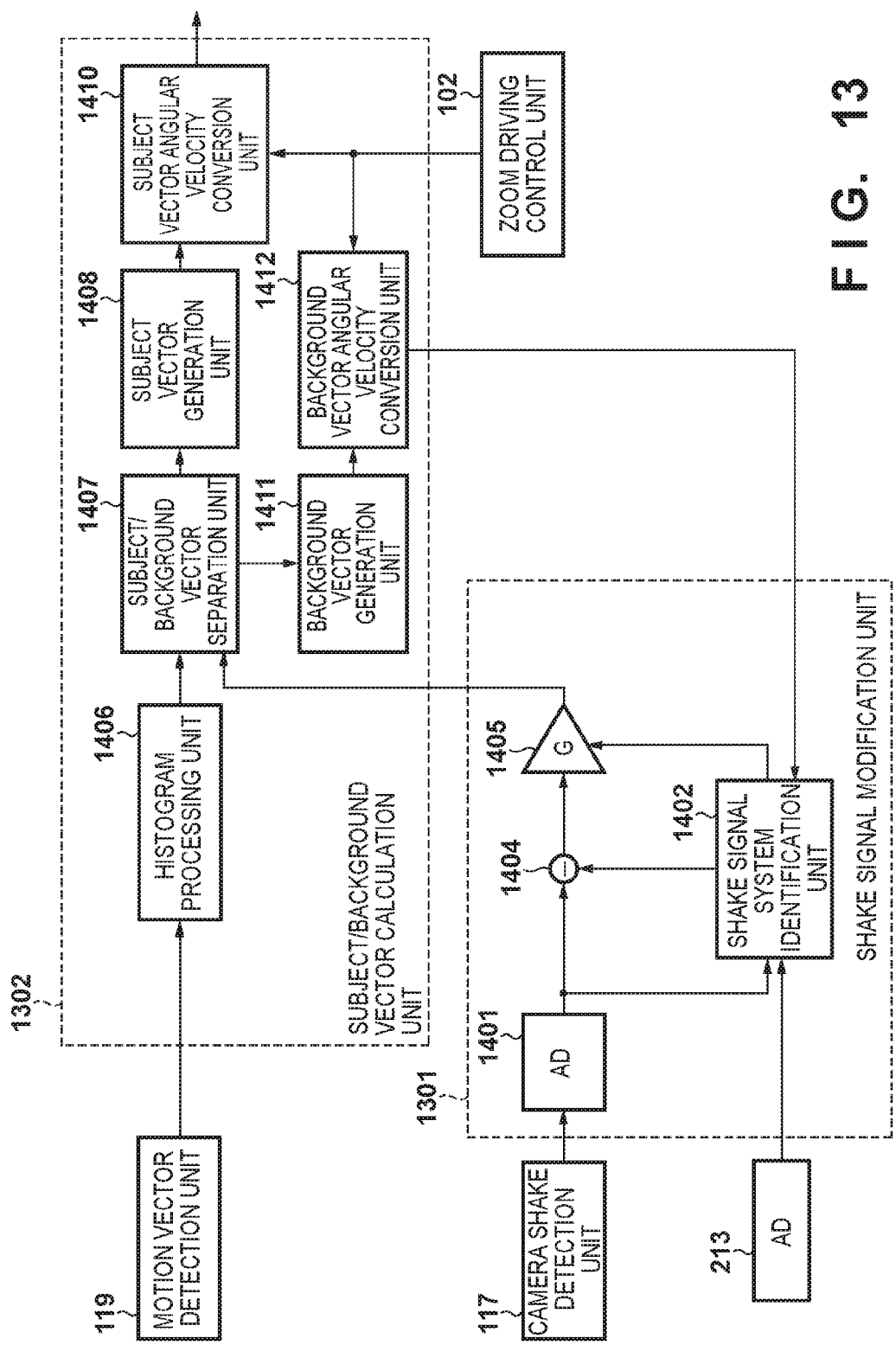
FIG. 13 is a block diagram illustrating a detailed configuration of a shake signal modification unit and a subject/background vector calculation unit according to the third embodiment.

FIG. 13 is a block diagram illustrating a detailed configuration of the shake signal modification unit 1301 and a subject/background vector calculation unit 1302 illustrated in FIG. 12. The position signal from the AD conversion unit 213, the angular velocity signal from the camera shake detection unit 117 that is AD converted by an AD conversion unit 1401, and the background vector are input into a shake signal system identification unit 1402. By the three inputted signals, the sensitivity and the offset of the angular velocity sensor are identified similarly to in the first embodiment. The identified offset is subtracted from the angular velocity signal in an offset subtraction unit 1404, and the identified sensitivity is reflected in the multiplication in a gain multiplication unit 1405.

Meanwhile, a histogram is generated in a histogram processing unit 1406 based on motion vectors detected in each region by the motion vector detection unit 119. Meanwhile, the angular velocity signal for which the output variation is modified by the shake signal modification unit 1301 is input into a subject/background vector separation unit 1407, compared with the motion vectors, and as described above, and subject vector and background vector separation processing is performed. A subject vector generation unit 1408 generates one subject vector by performing averaging processing on a motion vector group determined to be a subject vector. A background vector generation unit 1411 generates one background vector by performing averaging processing on a motion vector group determined to be a background vector.

Also, from the zoom driving control unit 102 illustrated in FIG. 1, the current focal length information is input. A subject vector angular velocity conversion unit 1410 uses the focal length information to convert the subject vector from a pixel conversion value of the image to an angular velocity conversion value. A background vector angular velocity conversion unit 1412 uses the focal length information to convert the background vector from a pixel conversion value of the image to an angular velocity conversion value.

By performing this sequence of processing every frame, the identification precision increases, and the precision of the separated subject vector increases. Also, by performing image stabilization control during still image exposure using a high precision subject vector that is separated by reflecting an identification offset and an identification gain whose precision is high immediately prior to the still image exposure, a blur of a subject that moves during exposure is corrected.

In this way, by virtue of the third embodiment, it is possible to improve panning shot assistance precision because it is possible to perform separation of a background vector and a subject vector with good precision.

Note that in the above described embodiment, a case where image stabilization is performed optically by driving a correction lens included in the image stabilization unit 105 is described, but the present invention is not limited to this. For example, a configuration may be taken in which the image capturing unit 109 is driven, or a configuration may be taken in which a correction lens and the image capturing unit 109 are both driven.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-217921, filed on Nov. 5, 2015, which is hereby incorporated by reference herein in its entirety.

What is claimed is:

1. An age stabilization apparatus comprising:
an identification unit that, based on an angular velocity signal outputted from an angular velocity sensor, a motion vector calculated from a difference between frames of images outputted from image sensor, and a position signal indicating a position of a correction unit that corrects a shake optically, identifies an output variation of the angular velocity sensor; and
a conversion unit that converts the angular velocity signal into a shake correction amount signal by correcting the angular velocity signal based on the output variation identified by the identification unit,
wherein the output variation is a variation of a sensitivity and an offset of the angular velocity sensor, and
wherein the conversion unit converts the angular velocity signal into the shake correction amount signal by applying the variation of the sensitivity of the angular velocity sensor and the offset of the angular velocity sensor to the angular velocity signal;
each unit is implemented by at least one processor or circuitry, or combination thereof.

2. The image stabilization apparatus according to claim 1, wherein a position detection unit that outputs the position detection signal detects the position of the correction unit and outputs the position signal, and the position detection unit is implemented by the at least one processor or circuitry, or combination thereof.

3. The image stabilization apparatus according to claim 2, wherein the position detection unit predicts the position of the correction unit from the angular velocity signal and outputs the position signal.

4. The image stabilization apparatus according to claim 1, wherein the conversion unit, based on the output variation, changes a coefficient used in the conversion.

5. The image stabilization apparatus according to claim 1, wherein
the identification unit uses a Kalman filter or a recursive least-squares method to perform the identification, and
the identification unit comprises a computation unit for computing an error diffusion of an identification result.

6. The image stabilization apparatus according to claim 5, wherein the conversion unit makes a frequency band to process wider in a case where the error diffusion is less than or equal to a predetermined range than in a case where the error diffusion is within the range.

7. The image stabilization apparatus according to claim 5, further comprising a distance detector that detects a distance to a subject, wherein
the computation unit changes the error diffusion into a larger value if the distance to the subject fluctuates by a predetermined value or greater.

8. The image stabilization apparatus according to claim 5, further comprising a driver that d a zoom lens for changing a focal length, wherein
the identification unit, if the focal length is a predetermined first focal length, sets a coefficient used for the identification so that a convergence speed of the identification become slower than a case of a second focal length that is longer than the first focal length.

9. The image stabilization apparatus according to claim 5, further comprising a shutter release capable of a two stage operation in accordance with a pressing amount, wherein the identification unit, at a time at which a first stage operation of the shutter release unit is performed, sets a coefficient used for the identification so that a convergence speed of the identification is faster than at other times.

10. The image stabilization apparatus according to claim 9, further comprising a driver that drives a focusing lens, wherein the time at which a first stage operation of the shutter release u is performed is a period from a time after a focus by a drive unit until a time prior to a still image capturing.

11. The image stabilization apparatus according to claim 5, further comprising a shutter release unit capable of a two stage operation in, accordance with a pressing amount, wherein a frame rate at a time at which a first stage operation of the shutter release unit is performed is higher than at other times.

12. The image stabilization apparatus according to claim 11, further comprising a driver that drives a focusing lens, wherein the time at which a first stage operation of the shutter release unit is performed is a period from a time after a focus by a drive unit until a time prior to a sty 11 image capturing.

13. The image stabilization apparatus according to claim 1, further comprising:

a second conversion unit that obtains a second shake correction amount based on, among the angular velocity signal outputted from the angular velocity sensor an angular velocity signal of a frequency band that is narrower than a frequency band used in the conversion to the shake correction amount by the conversion unit;

a selection unit that selects either the shake correction amount obtained by the conversion unit or the second shake correction amount obtained by the second conversion unit; and a driver that drives the correction unit based on the shake correction amount selected by the selection unit;

each the second conversion unit and the selection unit is implemented by the at least one processor or circuitry, or combination thereof.

14. The image stabilization apparatus according to claim 13, wherein the conversion unit includes an HR filter, and the conversion unit changes an intermediate variable simultaneously to changing a band of the IIR filter if the selection unit selects the second shake correction amount, and does not change the intermediate variable if the selection unit selects the shake correction amount obtained by the conversion unit.

15. The image stabilization apparatus according to claim 1, further comprising a determination unit that determines a reliability of the motion vector, wherein if the reliability of the motion vector is less than a predetermined reliability, the identification unit does not perform the identification;

the determination unit is implemented by the at least one processor or circuitry, or combination thereof.

16. The image stabilization apparatus according to claim 15, wherein the conversion unit includes an IIR filter, and if a time period over which the identification is not performed by the identification unit is continued for a predetermined duration that is determined in advance, the conversion unit reduces a band of the IIR filter.

17. The image stabilization apparatus according to claim 1, wherein if the angular velocity signal is not within a predetermined range, the identification unit does not perform the identification.

18. The image stabilization apparatus according to claim 1, wherein if a sum of the correction angular velocity obtained from the motion vector and the position signal is not within a predetermined range, the identification unit does not perform the identification.

19. The image stabilization apparatus according to claim 1, wherein the conversion unit converts the angular velocity signal into the shake correction amount signal by applying the variation of the sensitivity of the angular velocity sensor to the angular velocity signal to obtain an adjusted angular velocity signal and by adding the offset of the angular velocity sensor to the adjusted angular velocity signal to obtain the shake correction amount signal.

20. The image stabilization apparatus according to claim 19, wherein the adjusted angular velocity signal is obtained by multiplying the variation of the sensitivity by the angular velocity signal.

21. An image stabilization method, comprising:

identifying an output variation of an angular velocity sensor based on an angular velocity signal outputted from the angular velocity sensor, a motion vector calculated from a difference between frames of images outputted from an image sensor, and a position signal indicating a position of a correction unit that corrects a shake optically;

correcting the angular velocity signal based on the identified output variation and converting the corrected angular velocity signal into a shake correction amount signal; and correcting the shake based on the shake correction amount signal, wherein the output variation is a variation of a sensitivity and an offset of the angular velocity sensor; and wherein the angular velocity signal is corrected into the shake correction amount signal by applying the variation of the sensitivity of the angular velocity sensor and the offset of the angular velocity sensor to the angular velocity signal.

22. The image stabilization, method according to claim 21, wherein the position of the correction unit for correcting a shake optically is detected, and the position signal indicating the detected position is outputted.

23. The image stabilization method according to claim 21, wherein the position of the correction unit for correcting a shake optically is predicted from the angular velocity signal, and the position signal indicating the predicted position is outputted.

* * * * *